(12) United States Patent
Teo et al.

(10) Patent No.: US 8,295,014 B1
(45) Date of Patent: Oct. 23, 2012

(54) DISK DRIVE HEAD GIMBAL ASSEMBLY HAVING A FLEXURE TAIL WITH TRANSVERSE FLYING LEADS

(75) Inventors: Kia Moh Teo, San Jose, CA (US);
Yanning Liu, San Ramon, CA (US);
Tzong-Shii Pan, San Jose, CA (US);
Wing Chun Shum, San Mateo, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/164,959

(22) Filed: Jun. 21, 2011

Related U.S. Application Data

(63) Continuation-in-part of application No. 13/078,829, filed on Apr. 1, 2011, which is a continuation-in-part of application No. 12/916,237, filed on Oct. 29, 2010.

(51) Int. Cl.
*G11B 5/127* (2006.01)
(52) U.S. Cl. ................................... 360/245.9
(58) Field of Classification Search ............... 360/245.9, 360/245.7, 244.2, 244.5, 244.3, 234.6, 245.1, 360/245.6, 264.2, 244.9
See application file for complete search history.

(56) References Cited

U.S. PATENT DOCUMENTS

| | | | |
|---|---|---|---|
| 5,465,186 A * | 11/1995 | Bajorek et al. ............... 360/323 |
| 5,861,661 A | 1/1999 | Tang et al. |
| 5,903,056 A | 5/1999 | Canning et al. |
| 6,036,813 A | 3/2000 | Schulz et al. |
| 6,228,689 B1 | 5/2001 | Liu |
| 6,351,352 B1 * | 2/2002 | Khan et al. ............... 360/264.2 |
| 6,381,099 B1 | 4/2002 | Mei |
| 6,382,499 B1 | 5/2002 | Satoh et al. |
| 6,614,623 B2 | 9/2003 | Nakamura et al. |
| 6,639,757 B2 | 10/2003 | Morley et al. |
| 6,656,772 B2 | 12/2003 | Huang |
| 6,703,566 B1 | 3/2004 | Shiraishi et al. |
| 6,757,137 B1 | 6/2004 | Mei |
| 6,992,862 B2 | 1/2006 | Childers et al. |
| 7,075,701 B2 | 7/2006 | Novotny et al. |
| 7,154,708 B2 | 12/2006 | Chhabra et al. |
| 7,205,484 B2 | 4/2007 | Shiraishi et al. |
| 7,245,458 B2 | 7/2007 | Zhang et al. |
| 7,298,593 B2 | 11/2007 | Yao et al. |
| 7,359,154 B2 | 4/2008 | Yao et al. |

(Continued)

OTHER PUBLICATIONS

Notice of Allowance dated Apr. 11, 2012 from U.S. Appl. No. 13/078,829, 22 pages.

(Continued)

*Primary Examiner* — Allen Cao

(57) ABSTRACT

A head gimbal assembly for a disk drive includes a read head, a load beam, and a laminate flexure. The laminate flexure includes a structural layer, a dielectric layer, and a conductive layer that includes a plurality of electrical traces. The laminate flexure includes a tongue portion that connects to the read head, and a flexure tail that extends away from the tongue portion and includes a plurality of flexure bond pads that may facilitate ultrasonic or ACF bonding. Each of the plurality of flexure bond pads consists of a widened region of a corresponding one of the plurality of electrical traces in the conductive layer, and a gold coating upon the widened region. The widened region of each of the plurality of electrical traces extends transverse to the flexure tail's longitudinal axis at least 2.5 times more than it extends parallel to the flexure tail's longitudinal axis.

19 Claims, 7 Drawing Sheets

U.S. PATENT DOCUMENTS

| | | | |
|---|---|---|---|
| 7,372,669 | B2 | 5/2008 | Deguchi et al. |
| 7,375,874 | B1 | 5/2008 | Novotny et al. |
| 7,388,733 | B2 | 6/2008 | Swanson et al. |
| 7,394,139 | B2 | 7/2008 | Park et al. |
| 7,414,814 | B1 | 8/2008 | Pan |
| 7,440,236 | B1 | 10/2008 | Bennin et al. |
| 7,450,346 | B2 | 11/2008 | Arya et al. |
| 7,515,240 | B2 | 4/2009 | Lu et al. |
| 7,525,769 | B2 | 4/2009 | Yao et al. |
| 7,652,890 | B2 | 1/2010 | Ohsawa et al. |
| 7,697,102 | B2 | 4/2010 | Hirakata et al. |
| 7,764,467 | B2 | 7/2010 | Hanya et al. |
| 7,876,664 | B2 | 1/2011 | Tsukagoshi et al. |
| 8,015,692 | B1 * | 9/2011 | Zhang et al. .............. 29/603.14 |
| 8,111,483 | B2 | 2/2012 | Arai |
| 2001/0017749 | A1 | 8/2001 | Stefansky |
| 2005/0030670 | A1 | 2/2005 | Ando et al. |
| 2005/0243472 | A1 | 11/2005 | Kamigama et al. |
| 2006/0098347 | A1 | 5/2006 | Yao et al. |
| 2006/0146262 | A1 | 7/2006 | Yu et al. |
| 2006/0157869 | A1 | 7/2006 | Huang et al. |
| 2007/0246251 | A1 | 10/2007 | Shiraishi et al. |
| 2008/0002303 | A1 | 1/2008 | Wang et al. |
| 2008/0068757 | A1 | 3/2008 | Kamigama et al. |
| 2008/0088975 | A1 | 4/2008 | Bennin et al. |
| 2008/0225439 | A1 | 9/2008 | Komura |
| 2009/0151994 | A1 | 6/2009 | Ohsawa et al. |
| 2009/0211789 | A1 | 8/2009 | Yeates et al. |
| 2009/0253233 | A1 | 10/2009 | Chang et al. |
| 2010/0118444 | A1 * | 5/2010 | Rothenberg et al. ....... 360/245.9 |
| 2010/0176827 | A1 | 7/2010 | Yamazaki et al. |
| 2010/0188778 | A1 * | 7/2010 | Castagna ................... 360/245.9 |
| 2010/0195474 | A1 | 8/2010 | Tsukuda et al. |
| 2011/0317309 | A1 | 12/2011 | Shum et al. |
| 2012/0067626 | A1 | 3/2012 | Mizutani |

OTHER PUBLICATIONS

Notice of Allowance dated May 21, 2012 from U.S. Appl. No. 13/164,936, 17 pages.

Notice of Allowance dated May 21, 2012 from U.S. Appl. No. 13/398,578, 16 pages.

US 7,337,529, 03/2008, Bennin et al. (withdrawn)

* cited by examiner

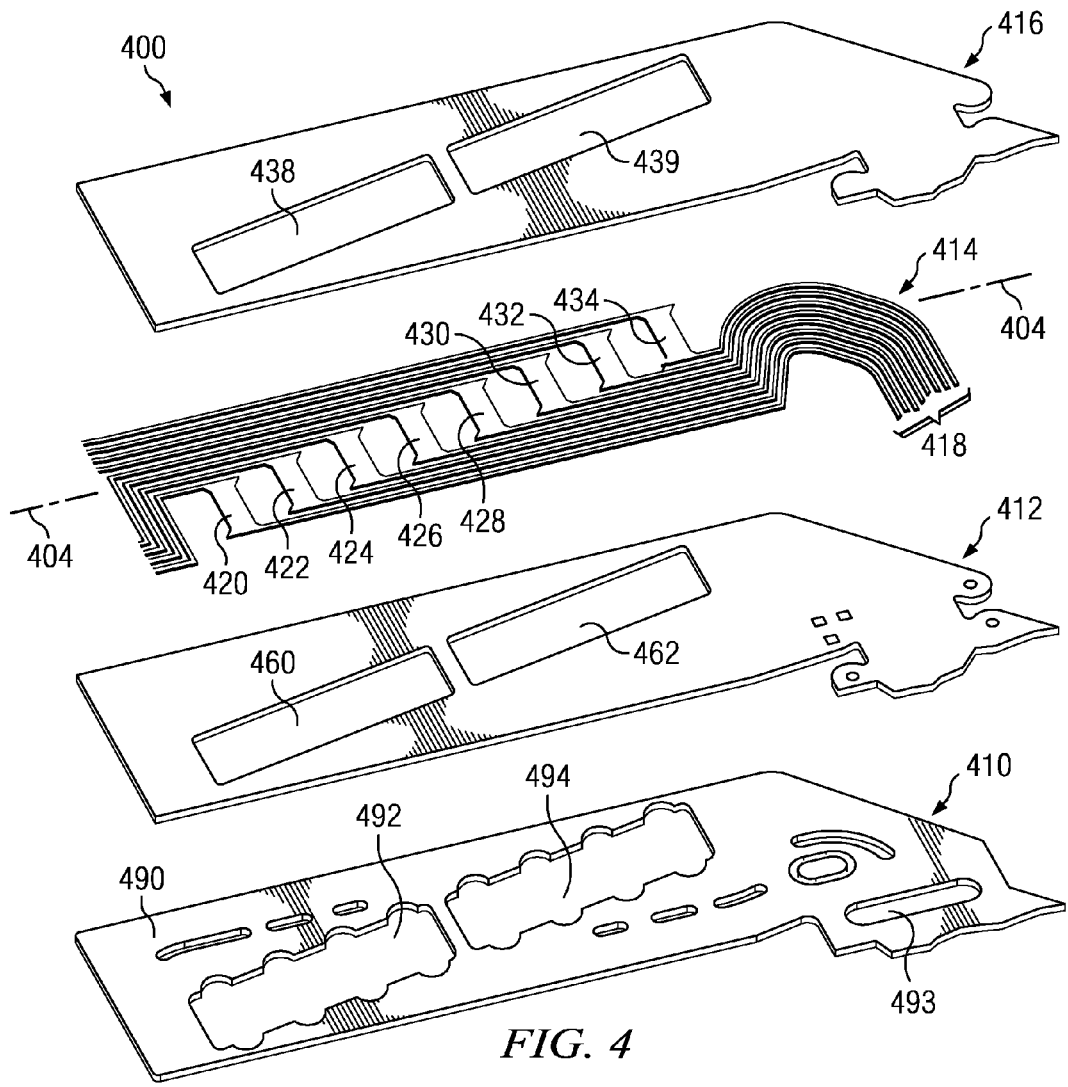
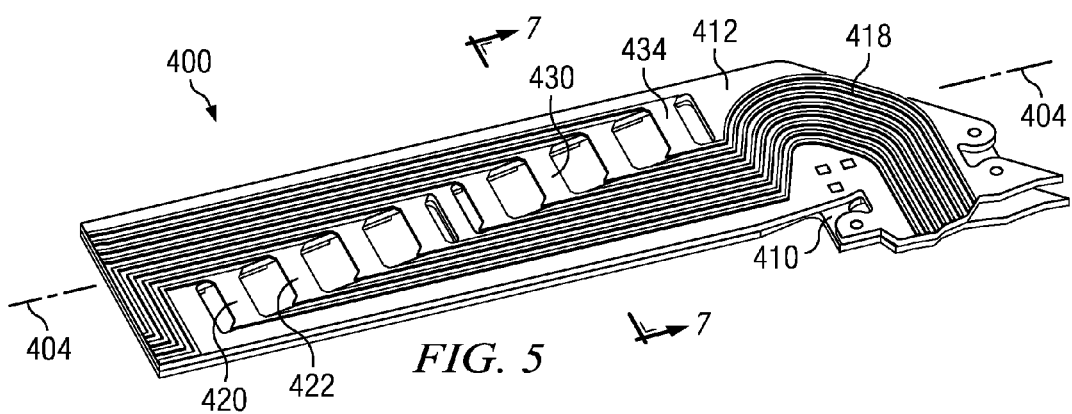

DISK DRIVE HEAD GIMBAL ASSEMBLY HAVING A FLEXURE TAIL WITH TRANSVERSE FLYING LEADS

CROSS-REFERENCE TO RELATED APPLICATIONS

This application is a continuation-in-part of pending U.S. patent application Ser. No. 13/078,829, filed Apr. 1, 2011, and entitled "Disk drive head gimbal assembly having a flexure tail with features to facilitate bonding," which is itself a continuation-in-part of pending U.S. patent application Ser. No. 12/916,237, filed Oct. 29, 2010, and entitled "Disk drive head gimbal assembly having a flexure tail with folded bond pads." Priority benefit is claimed herein from both of these pending patent applications, and both are incorporated herein by reference in their entirety.

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a modern magnetic hard disk drive device, each head is a sub-component of a head-gimbal assembly (HGA) that typically includes a laminated flexure to carry the electrical signals to and from the head. The HGA, in turn, is a sub-component of a head-stack assembly (HSA) that typically includes a plurality of HGAs, an actuator, and a flexible printed circuit (FPC). The plurality of HGAs are attached to various arms of the actuator.

Modern laminated flexures typically include conductive copper traces that are isolated from a stainless steel structural layer by a polyimide dielectric layer. So that the signals from/to the head can reach the FPC on the actuator body, each HGA flexure includes a flexure tail that extends away from the head along a corresponding actuator arm and ultimately attaches to the FPC adjacent the actuator body. That is, the flexure includes traces that extend from adjacent the head and continue along the flexure tail to electrical connection points. The FPC includes conductive electrical terminals that correspond to the electrical connection points of the flexure tail.

To facilitate electrical connection of the conductive traces of the flexure tails to the conductive electrical terminals of the FPC during the HSA manufacturing process, the flexure tails must first be properly positioned relative to the FPC so that the conductive traces of the flexure tails are aligned with the conductive electrical terminals of the FPC. Then the flexure tails must be held or constrained against the conductive electrical terminals of the FPC while the aforementioned electrical connections are made. Such electrical connections may be made by ultrasonic bonding, which is a process during which ultrasonic wave energy is applied by a tool tip that presses upon bond pads of the flexure tail, to cause a gold plating on the flexure tail bond pads to join another gold plating upon the electrical terminals of the FPC.

However, recently for some disk drive products, flexure tail to FPC electrical connections may employ a type of anisotropic conductive film (ACF) bonding. An anisotropic conductive film is typically an adhesive doped with conductive beads or cylindrical particles of uniform or similar diameter. As the doped adhesive is compressed and cured, it is squeezed between the surfaces to be bonded with sufficient uniform pressure that a single layer of the conductive beads makes contact with both surfaces to be bonded. In this way, the thickness of the adhesive layer between the bonded surfaces becomes approximately equal to the size of the conductive beads. The cured adhesive film may conduct electricity via the contacting beads in a direction normal to the bonded surfaces (though may not necessarily conduct electricity parallel to the bonded surfaces, since the beads may not touch each other laterally—though axially each bead is forced to contact both of the surfaces to be bonded—hence the term "anisotropic").

The flexure tail design requirements to enable or facilitate ACF bonding contrast with those for ultrasonic bonding. For example, ultrasonic bonding pads need only accommodate contact by a relatively small tool tip, while designs for ACF bonding are designed to accommodate a larger bonding tool called a "thermode," which applies a more uniform pressure and heat to the bond pad(s) during adhesive curing. The uniform pressure and heat may cause a single layer of conductive beads in an ACF to make contact with both opposing surfaces to be bonded. Also, for example, the conductivity through the beads of a cured ACF bond is substantially less than that of the intimate gold contact of an ultrasonic bond, and so the cured ACF bond must cover a larger area in order to present acceptable net conductance.

However, industrial decisions affecting manufacturing facilities and equipment, operator training, parts and materials flow through the factory, inventory, etc, might be given more freedom if the same flexure tail design could facilitate both ACF bonding or ultrasonic bonding. For example, there is a need in the art for a manufacturing manager to be free to direct the same manufacturing lot of HGAs to be bonded by either ultrasonic bonding or by ACF bonding. Accordingly, there is a need in the art for an improved HGA design that can facilitate bonding by either ultrasonic bonding or ACF bonding, during HSA manufacture.

BRIEF DESCRIPTION OF THE DRAWINGS

FIG. 4 is an exploded perspective view of a flexure tail terminal region, according to an embodiment of the present invention.

FIG. 5 is a perspective view of a flexure tail terminal region, according to an embodiment of the present invention.

DESCRIPTION OF THE PREFERRED EMBODIMENTS

Figure 1:
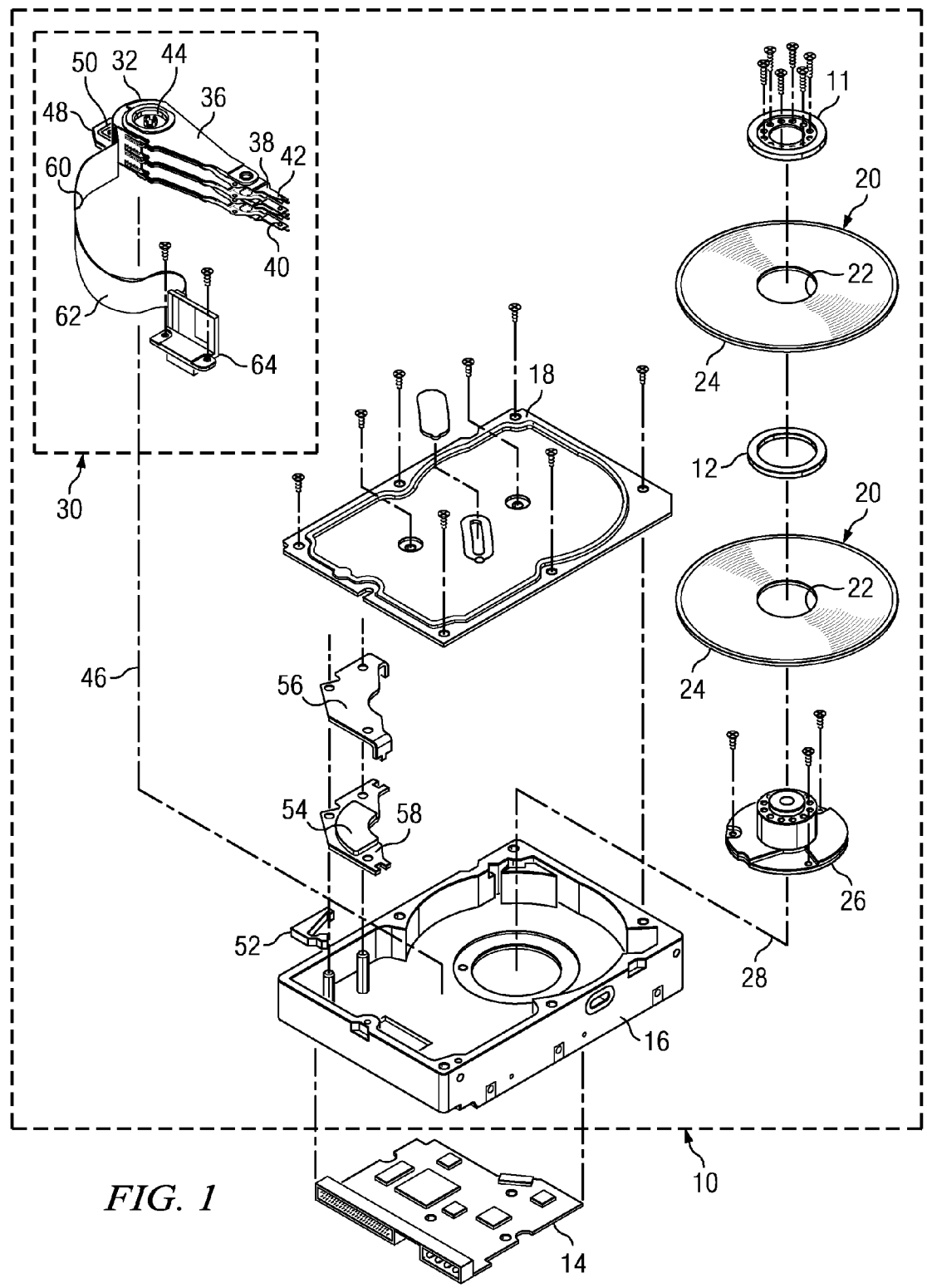
FIG. 1 is an exploded perspective view of a disk drive according to an embodiment of the present invention.

FIG. 1 is an exploded perspective view of a disk drive according to an example embodiment of the present invention. The disk drive includes a head disk assembly (HDA) 10 and a printed circuit board assembly (PCBA) 14. The HDA 10 includes a base 16 and cover 18 that together house at least one annular magnetic disk 20. Each disk 20 contains a plurality of magnetic tracks for storing data. The tracks are disposed upon opposing first and second disk surfaces of the disk 20 that extend between an inner disk edge 22 (corresponding to the inner diameter) and an outer disk edge 24 (corresponding to the outer diameter) of the disk 20. The head disk assembly 10 further includes a spindle motor 26 for rotating the disk 20 about a disk axis of rotation 28. The spindle motor 26 includes a spindle motor hub that is rotatably attached to the base 16 of the HDA 10. Disks 20 may be stacked and separated with one or more annular disk spacers 12 that are disposed about the hub, all held fixed to the hub by disk clamp 11.

The HDA 10 further includes a head stack assembly (HSA) 30 rotatably attached to the base 16 of HDA 10. The HSA 30 includes an actuator comprising an actuator body 32 and one or more actuator arms 36 extending from the actuator body 32. The actuator body 32 includes a bore 44 and a pivot bearing cartridge engaged within the bore for facilitating the HSA 30 to rotate relative to HDA 10 about actuator pivot axis 46. One or two head gimbal assemblies (HGA) 38 are attached to a distal end of each actuator arm 36. Each HGA 38 includes a head (e.g. head 40) for reading and writing data from and to the disk 20, and a load beam 42 to compliantly preload the head against the disk 20. The HSA 30 further includes a coil support 48 that extends from one side of the HSA 30 that is opposite head 40. The coil support 48 is configured to support a coil 50 through which a controlled electrical current is passed. The coil 50 interacts with one or more magnets 54 that are attached to base 16 via a yoke structure 56, 58 to form a voice coil motor for controllably rotating the HSA 30. The HDA 10 includes a latch 52 rotatably mounted on base 16 to prevent undesired rotations of HSA 30.

The PCBA 14 includes a servo control system for generating servo control signals to control the current through the coil 50 and thereby position the HSA 30 relative to tracks disposed upon surfaces of disk 20. The HSA 30 is electrically connected to the PCBA 14 via a flexible printed circuit (FPC) 60, which includes a flex cable 62 and a flex cable support bracket 64. The flex cable 62 supplies current to the coil 50 and carries signals between the HSA 30 and the PCBA 14.

In the magnetic hard disk drive of FIG. 1, the head 40 includes a body called a "slider" that carries a magnetic transducer on its trailing end (not visible given the scale of FIG. 1). The magnetic transducer may include an inductive write element and a magnetoresistive read element. During operation the transducer is separated from the magnetic disk by a very thin hydrodynamic air bearing. As the motor 26 rotates the magnetic disk 20, the hydrodynamic air bearing is formed between an air bearing surface of the slider of the head 40, and a surface of the magnetic disk 20. The thickness of the air bearing at the location of the transducer is commonly referred to as "flying height."

Figure 2:
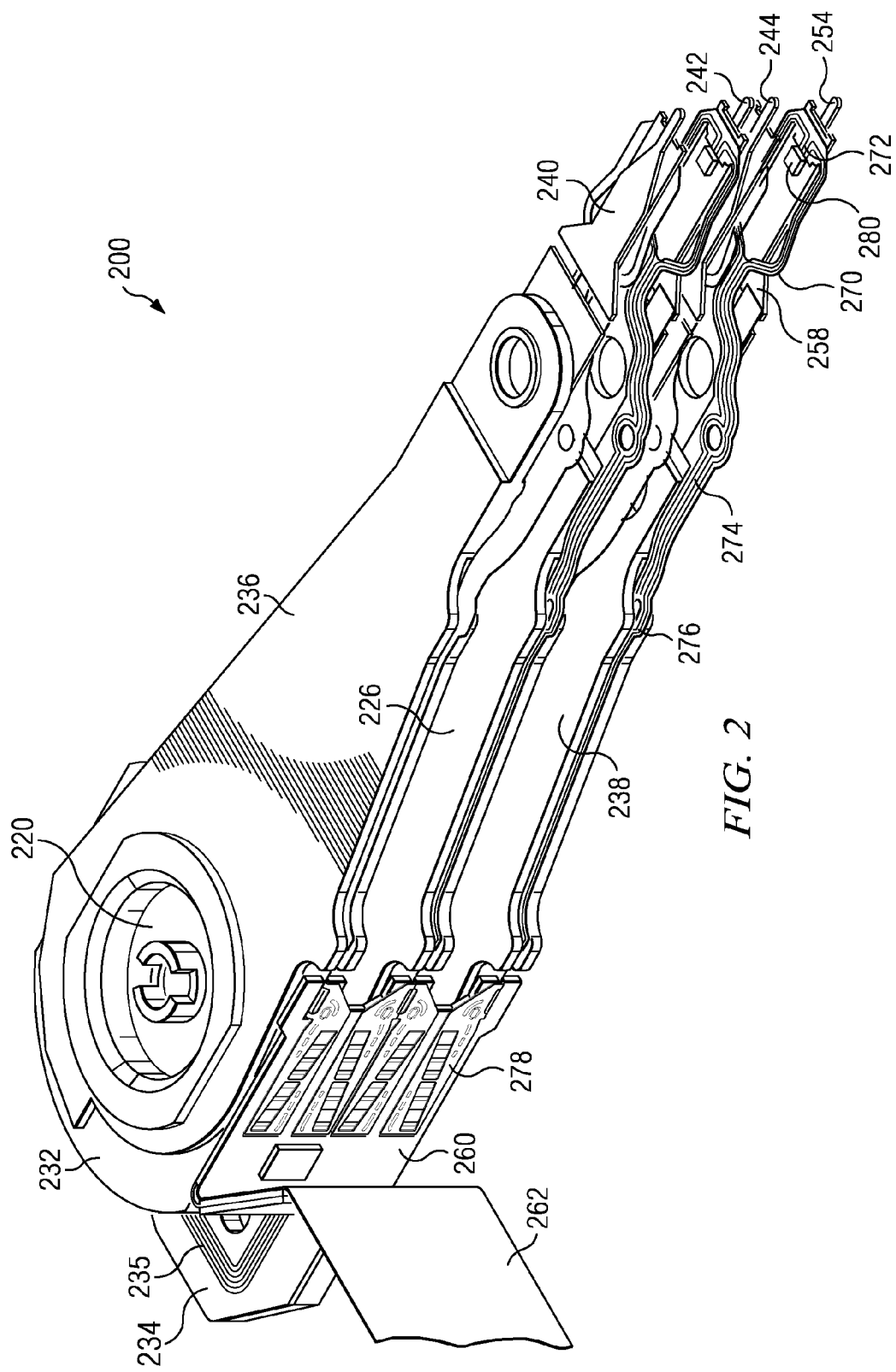
FIG. 2 is a perspective view of a head stack assembly (HSA) according to an embodiment of the present invention.

FIG. 2 is a perspective view of a head stack assembly (HSA) 200 according to an example embodiment of the present invention. The HSA 200 includes an actuator body 232 and a plurality of actuator arms 226, 236, 238 extending from the actuator body 232. The actuator body 232 includes a pivot bearing cartridge 220 disposed in the actuator bore, and a coil support 234 that supports a coil 235 and extends from the actuator body 232 in a direction that is generally opposite the actuator arms 226, 236, 238. The HSA 200 also includes a plurality of head gimbal assemblies (HGA) 240, 242, 244, 254, attached to the actuator arms 226, 236, 238. For example, such attachment may be made by swaging. Note that the inner actuator arm 226 includes two HGAs, while each of the outer actuator arms 236, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a dummy mass.

Each HGA includes a head for reading and/or writing to an adjacent disk surface (e.g. HGA 254 includes head 280). The head 280 is attached to a tongue portion 272 of a laminated flexure 270. The laminated flexure 270 is part of the HGA 254, and is attached to a load beam 258 (another part of the HGA 254). The laminated flexure 270 may include a structural layer (e.g. stainless steel), a dielectric layer (e.g. polyimide), and a conductive layer into which traces are patterned (e.g. copper). The HSA 200 also includes a flexible printed circuit (FPC) 260 adjacent the actuator body 232, and the FPC 260 includes a flex cable 262. The FPC 260 may comprise a laminate that includes two or more conventional dielectric and conductive layer materials (e.g. one or more polymeric materials, copper, etc). The laminated flexure 270 includes a flexure tail 274 that includes an intermediate region 276 that is disposed adjacent the actuator arm 238, and a terminal region 278 that is electrically connected to bond pads of the FPC 260.

Figure 3:
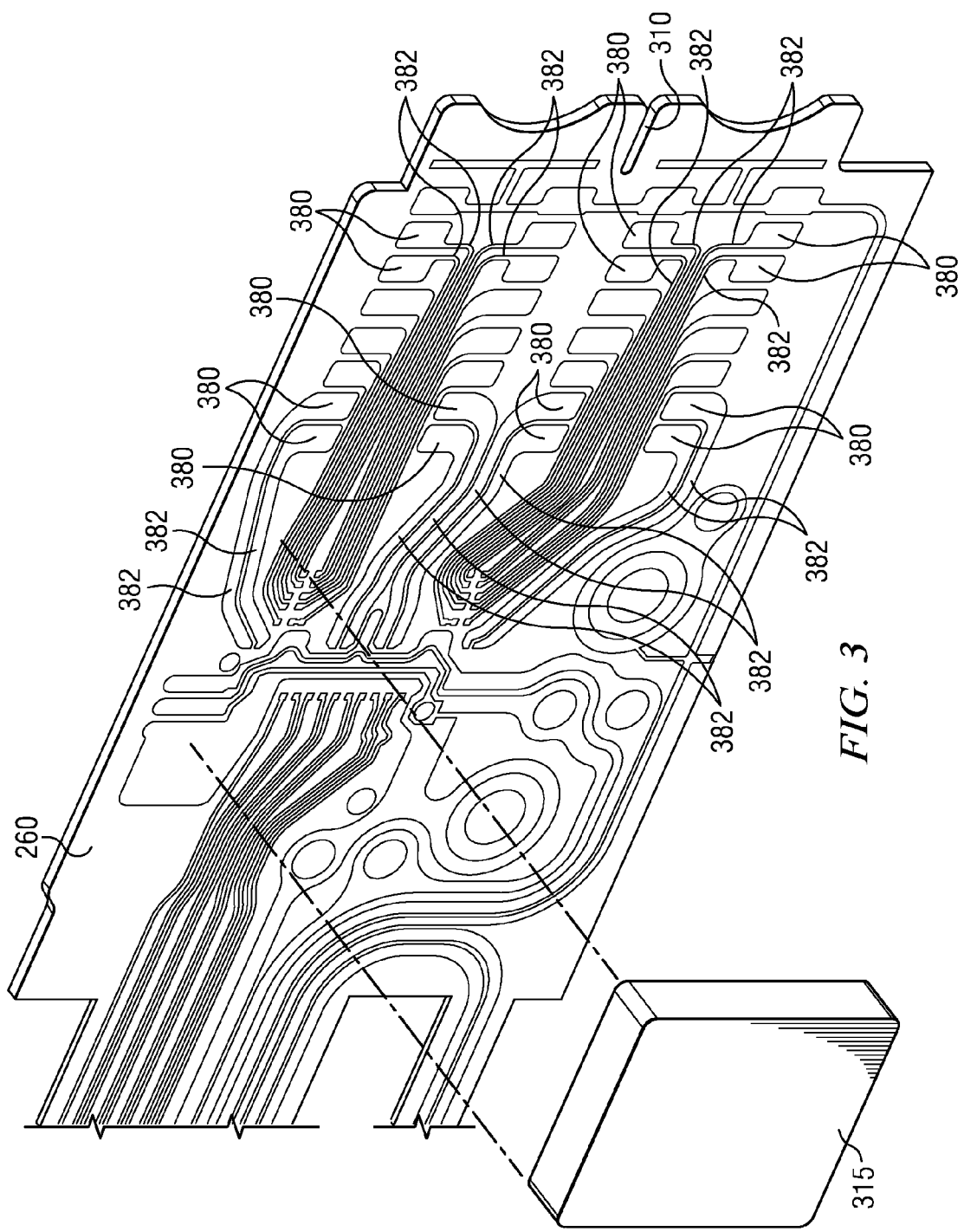
FIG. 3 is a perspective view of a portion of a flexible printed circuit (FPC) according to an embodiment of the present invention.

FIG. 3 depicts the FPC 260 before flexure tail terminal regions (e.g. flexure tail terminal region 278) are bonded thereto. The FPC 260 includes electrical conduits 382 that terminate at FPC bond pads 380, which are aligned with and connected to flexure bond pads of the terminal regions (e.g. flexure tail terminal region 278) of the HGA flexure tails. The FPC electrical conduits 382 may connect to a pre-amplifier chip 315 (shown exploded from the FPC 260 in FIG. 3. Intermediate regions of two of the HGA flexure tails (e.g. flexure tail intermediate region 276) may pass through the FPC slit 310 to help facilitate their support and alignment.

The FPC 260 may include an optional insulative cover layer having windows exposing the regions where the flexure tail terminal regions and the pre-amplifier chip 315 are bonded thereto. Such cover layer is not shown in the view of FIG. 3, so that the electrical conduits 382 could be shown without being obscured or partially obscured by the cover layer.

FIG. 4 is an exploded perspective view of a terminal region of a flexure tail 400, according to an embodiment of the present invention. The flexure tail 400 of the laminate flexure comprises a structural layer 410, a dielectric layer 412, a conductive layer 414, and an optional insulative cover layer 416. FIG. 5 depicts the same terminal region of flexure tail 400, except unexploded and without the optional cover layer 416.

Now referring to FIGS. 4 and 5, the structural layer 410 may comprise stainless steel, the dielectric layer 412 may comprise polyimide, the conductive layer 414 may comprise copper, and the cover layer may comprise an insulative polymer, for example, though it is contemplated that other materials providing similar function might be used instead. In the embodiment of FIGS. 4 and 5, the structural layer 410 and the dielectric layer 412 are absent in many locations on the flexure tail 400, but where present in the flexure tail 400, the thickness of the structural layer 410 may be preferably at least 15 microns, and the thickness of the dielectric layer 412 may be preferably at least 5 microns.

In the embodiment of FIGS. 4 and 5, the conductive layer 414 of the flexure tail 400 includes eight electrical traces 418. Each of the electrical traces 418 includes a corresponding one of a plurality of widened regions 420, 422, 424, 426, 428, 430, 432, 434 to be bonded to the FPC (e.g. FPC 260 shown in FIG. 3). Each widened region 420, 422, 424, 426, 428, 430, 432, 434 defines a "flexure bond pad" or flexure bond pad location.

Each of the widened regions 420, 422, 424, 426, 428, 430, 432, 434 defines a widened region width that is measured parallel to the flexure tail longitudinal axis 404. In this context, "widened" means that the widened region width of each trace 418 is wider than the width of that trace 418 in an intermediate region where the flexure tail 400 runs along the arm (i.e. the width of a trace 418 at the right side of FIG. 4). Each of the plurality of widened regions 420, 422, 424, 426, 428, 430, 432, 434 includes a gold coating (e.g. a gold plating), and may be preferably aligned with a corresponding one of the plurality of FPC bond pads 380 shown in FIG. 3. The gold coating is disposed on at least on the side of each widened region that faces the FPC 260, but the gold coating may also be disposed on the opposing side and/or edges of each widened region, e.g. for plating convenience or other fabrication convenience.

As shown in FIGS. 4 and 5, each of the widened regions 420, 422, 424, 426, 428, 430, 432, 434 in this embodiment extends further transverse to the flexure tail longitudinal axis 404 than it extends parallel to the flexure tail longitudinal axis 404. Preferably, each of the plurality of the widened regions 420, 422, 424, 426, 428, 430, 432, 434 extends transverse to the flexure tail longitudinal axis 404 at least 2.5 times more than it extends parallel to the flexure tail longitudinal axis 404. In this context "parallel" does not imply perfectly parallel, but rather approximately parallel (e.g. ±10 degrees from perfectly parallel). Likewise, "transverse" does not imply perfectly perpendicular, but rather approximately perpendicular (e.g. ±10 degrees from perfectly perpendicular).

In certain embodiments, the foregoing inequality may facilitate ACF bonding by the geometry accommodating a thermode tool, with adequate overlap between the flexure tail bond pads and FPC bond pads for acceptable conductivity despite position tolerance and variation. In certain embodiments, the foregoing inequality may also render the widened regions to be relatively less sensitive to transverse misalignment with the corresponding FPC bond pad 380 of FIG. 3. Such transverse misalignment during disk drive assembly may be caused by FPC position variability (e.g. due to alignment pin to hole clearance), and/or undesired movement of the flexure tail by a manufacturing employee. Note that, during disk drive assembly, a manufacturing employee may more easily misalign the terminal region of the flexure tail 400 transverse to the flexure tail longitudinal axis 404 than parallel to the flexure tail longitudinal axis 404, since the flexure is difficult to stretch, and so moves more easily in the transverse direction.

Also in the embodiment of FIGS. 4 and 5, the structural layer 410 includes a peripheral frame 490 that defines and surrounds two structural layer windows 492, 494. The peripheral frame 490 underlies a region of the plurality of electrical traces 418 where the traces are relatively narrow. In the embodiment of FIG. 4, the structural layer windows 492, 494 each have a closed and continuous inner contour. In the embodiment of FIGS. 4 and 5, the structural layer windows 492, 494 are disposed in general alignment with groups of the widened regions in the conductive layer. For example, structural layer window 492 is disposed in general alignment with widened regions 420, 422, 424, and 426, while structural layer window 494 is disposed in general alignment with widened regions 428, 430, 432, and 434.

In the embodiment of FIGS. 4 and 5, the dielectric layer 412 electrically insulates the conductive traces 418 of the conductive layer 414 from the structural layer 410. Such electrical insulation may be desired because the structural layer 410 may be electrically conductive (e.g. stainless steel), and so otherwise the structural layer 410 may cause an electrical short between the traces 418 and/or from the traces 418 to ground. In the embodiment of FIGS. 4 and 5, the dielectric layer 412 includes two dielectric layer windows 460, 462 that are disposed in general alignment with groups of the widened regions in the conductive layer (i.e. general alignment with groups of flexure bond pads).

In the embodiment of FIG. 4, the optional cover layer 416 includes two cover layer windows 438, 439 that each span the a group of flexure bond pads parallel and transverse to the flexure tail longitudinal axis 404, and that spans the plurality of flexure bond pads transverse to the flexure tail longitudinal axis 404. Such cover layer windows 438, 439 may permit bonding access to the widened regions 420, 422, 424, 426, 428, 430, 432, 434 of the conductive layer 414, while advantageously covering some other regions of the electrical traces 418 that are not to be bonded. This optional feature of the flexure tail 400 may improve handling robustness of the HGA during manufacture.

Note that because of the windows 492, 494, 460, 462, 438, 439 described in preceding paragraphs herein, the structural layer 410, dielectric layer 412, and the cover layer 416 may be absent in each of the plurality of flexure bond pads that are defined by the widened regions 420, 422, 424, 426, 428, 430, 432, 434. In certain such embodiments, the thickness of the conductive layer 414 may be less than 15 microns, and a thickness of gold plating on the widened regions may preferably be at least 1 micron to facilitate ultrasonic bonding (it could be thinner if solder bonding were instead contemplated). Hence, in certain embodiments, a total thickness at each of the plurality of flexure bond pads may be no more than 24 microns.

In certain embodiments, each of the plurality of widened regions 420, 422, 424, 426, 428, 430, 432, 434 has a widened region width that is preferably at least 150 microns, to ensure adequate area of overlap and conductivity for ACF bonding, considering horizontal positioning tolerance. Note that the widened region might be substantially narrower in prior art designs (for ultrasonic bonding without concern for ACF), because the higher conductance of ultrasonic bond allows less overlap. Indeed the minimum width in such prior art designs might be limited by only mechanical strength concerns, for example to 75 microns. Mechanical strength can be a concern since the widened region lacks the structural layer 410 and the dielectric layer 412, having only the conductive layer 414 and gold coating(s).

In certain embodiments, the maximum width of each widened region may preferably be limited to 200 microns. Such inequality may be advantageous because each copper trace 418 is narrower away from the widened region, and if the trace expands too dramatically to create the widened region, then there is a greater impedance discontinuity that (at high enough data rates or frequencies) may cause undesirable signal reflections. Hence, trace width changes that are too large and abrupt may adversely affect data rate.

Also, in certain embodiments, each of the flexure bond pads defined by the widened regions 420, 422, 424, 426, 428, 430, 432, 434, may preferably be separated from one another in a direction measured parallel to the flexure tail longitudinal axis 404, by an inter bond pad spacing of at least 0.3 mm but no more than 0.7 mm. Such inequality may advantageously accommodate horizontal positioning tolerance and reduce the possibility of shorting between bond pads.

In certain embodiments, each of the plurality of widened regions 420, 422, 424, 426, 428, 430, 432, 434 defines a widened region length that is measured transverse to the flexure tail longitudinal axis 404, and that is preferably but not necessarily in the range 0.585 mm to 0.600 mm. In certain embodiments, then, the widened region of each of the plurality of electrical traces may define a widened region area that is at least 0.03 mm$^2$. The widened region length may be limited by the available height for the flexure tail 400 within the disk drive (with the available height often being limited by the spacing between disks in a multi-disk disk drive). The widened region length may also be limited by the geometry of a thermode tool, and/or may also be limited by a need for other traces 418 of the flexure tail 400 to bypass the widened region of a particular trace 418 (e.g. for the other traces 418 to reach more distal bond pads, and/or to reach testing pads that later may be removed).

Figure 6:
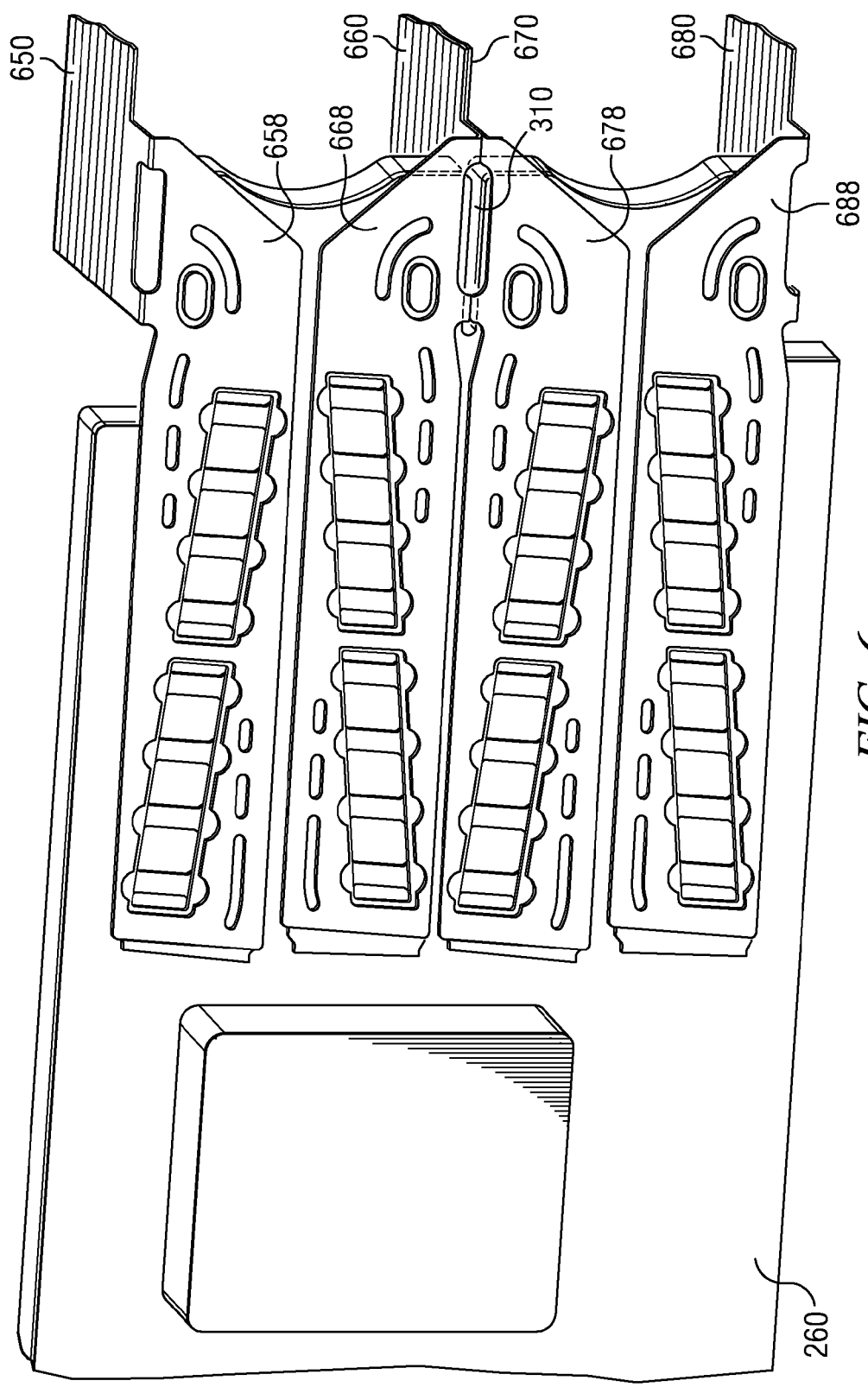
FIG. 6 is a perspective view of a plurality of flexure tail terminal regions attached to the FPC of FIG. 3, according to an embodiment of the present invention.

FIG. 6 is a perspective view of a plurality of flexure tail terminal regions 658, 668, 678, 688 of flexure tails 650, 660, 670, 680 attached to the FPC 260 of FIG. 3, according to an embodiment of the present invention. Intermediate regions of flexure tails 660, 670 may extend into the slit 310, to facilitate alignment and support. Note that in the example embodiment of FIG. 6, each of the flexure tails 650, 660, 670, 680 is bent in the intermediate region so that each of the flexure tail terminal regions 658, 668, 678, 688 is substantially orthogonal to the intermediate region of the same flexure tail. In the embodiment of FIG. 4, such bending may be facilitated by an optional opening (e.g. opening 493) that locally weakens the structural layer 410.

Figure 7:
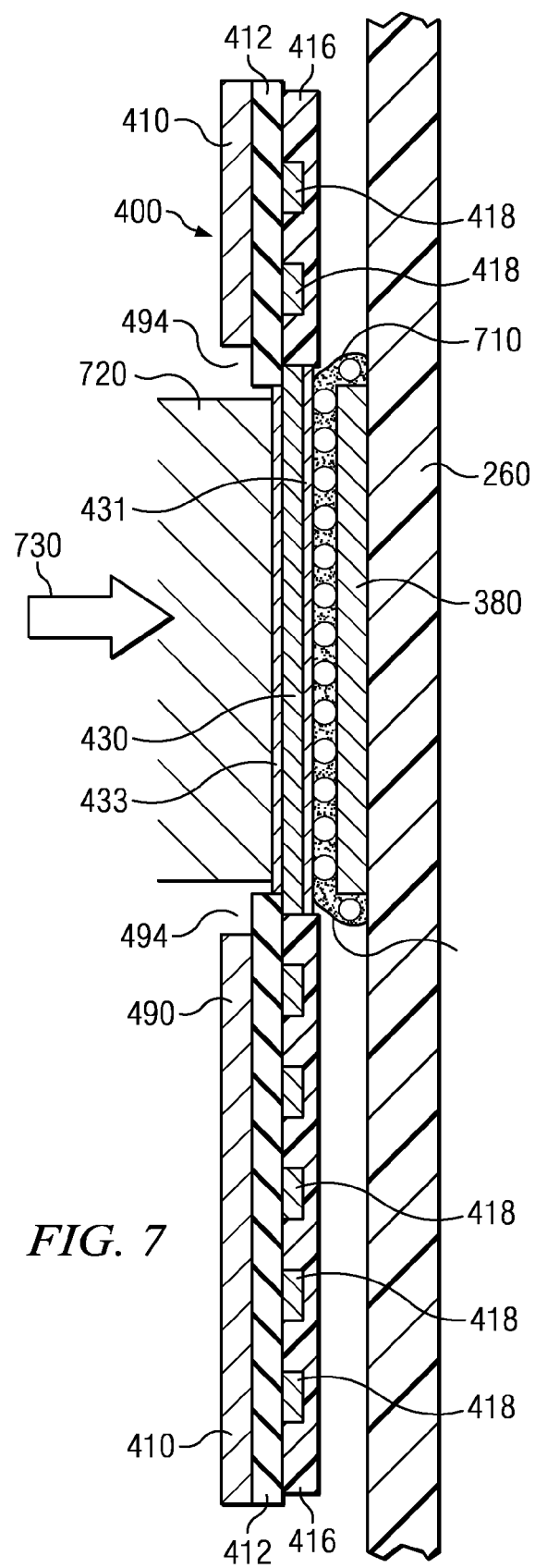
FIG. 7 depicts the bonding of a flexure bond pad to a corresponding flexible printed circuit bond pad by an anisotropic conductive film, according to an embodiment of the present invention.

In certain embodiments, each of the flexure bond pads may be bonded to a corresponding one of the plurality of FPC bond pads 380 by an anisotropic conductive film (ACF). For example, FIG. 7 depicts the bonding of a widened region 430 of a flexure tail 400, to a corresponding FPC bond pad 380, by an ACF 710. Now referring to FIGS. 3, 4, 5, 6, and 7, a thermode tool 720 may be brought into contact with the widened region 430 (which may include gold coatings 431, 433), to press it against the FPC bond pad 380 for a period with the ACF 710 in between. The ACF may be disposed only on the FPC bond pads 380, as shown in FIG. 6, or alternatively over the FPC bond pads 380 and over a larger region of the FPC 260 around the FPC bond pads 380. For example, in certain embodiments, the ACF may be disposed over the entire surface of the FPC 260 that includes the FPC bond pads 380. The FPC 260 may also include its own insulative cover layer around the FPC bond pads 380 so that the sides of the FPC bond pads 380 are not exposed.

As shown in FIG. 7, the ACF 710 may comprise an adhesive material that includes a plurality of electrically conductive beads of substantially similar diameter. In certain embodiments the ACF 710 may employ beads of non-spherical shape, such as cylindrical beads or needle shaped beads. In certain embodiments the adhesive material may be deposited on to the FPC bond pad 380 prior to aligning the widened region 430 therewith. Alternatively, the adhesive material may be deposited on a first side of the widened region 430 (e.g. facing the FPC bond pad 380) prior to bringing the thermode tool 720 into contact with an opposing second side of the widened region 430 (facing the thermode tool 720).

As shown in FIG. 7, the force 730 that presses (via the thermode tool 720) the flexure bond pads against FPC bond pads 380 during the period of bonding, may arrange the plurality of electrically conductive beads of the ACF 710 in a monolayer. Each of the plurality of electrically conductive beads in the monolayer may be in electrical contact with both the widened region 430 and the corresponding FPC bond pad 380. The thermode tool 720 may also transfer heat through the widened region 430 during the period of bonding, and raise the temperature of the ACF 710 during such period, for example to accelerate curing of the adhesive material.

In certain embodiments, the force 730 of the thermode tool 720 is sufficient to cause the electrically conductive beads of the ACF 710 to be substantially elastically deformed in compression between the widened region 430 and the corresponding FPC bond pad 380 during the period of thermal curing of the adhesive material. After the thermode tool 720 is removed, the electrically conductive beads cool (with the cured adhesive) from an elevated curing temperature. Such cooling causes the electrically conductive beads to shrink relative to their expanded size during thermal curing of the adhesive material.

However, the force 730 is preferably chosen to be great enough that the post-curing shrinkage of the electrically conductive beads cannot completely relieve the compressive deformation that was experienced during curing. Hence, after curing of the adhesive material, and after removal of the thermode tool 720, the electrically conductive beads of the ACF 710 may remain in compression (and somewhat compressively deformed) between the widened region 430 and the corresponding FPC bond pad 380.

Although residual compression of the electrically conductive beads may correspond to some residual tension in the cured adhesive material of the ACF 710, such residual compression of the electrically conductive beads may be desirable to enhance and ensure reliable electrical conductivity of the ACF 710. For example, in the case where the electrically conductive beads are spherical, the residual compression may cause small flat spots where the electrically conductive beads contact the widened region 430 and the corresponding FPC bond pad 380. Such flat spots can provide finite contact areas rather than point contacts, which may desirably reduce the electrical resistance of the ACF 710.

To help facilitate higher volume manufacturing, the thermode tool 720 may include a flat surface that is substantially longer along the longitudinal axis 404 than any of the flexure bond pads, so that several widened regions of the conductive layer 414 may be subjected to the applied pressure and heat transfer simultaneously. However, in the embodiment of FIG. 7, the thermode tool 720 is not so large that it would overlap with the peripheral frame 490 (which might cause a cover layer 416 above the traces 418 to contact the FPC 260, thereby potentially interfering with the application of uniform pressure to the widened region 430). Rather, in the embodiment of FIG. 7, the thermode tool 720 preferably fits within the structural layer window 494.

Figure 8:
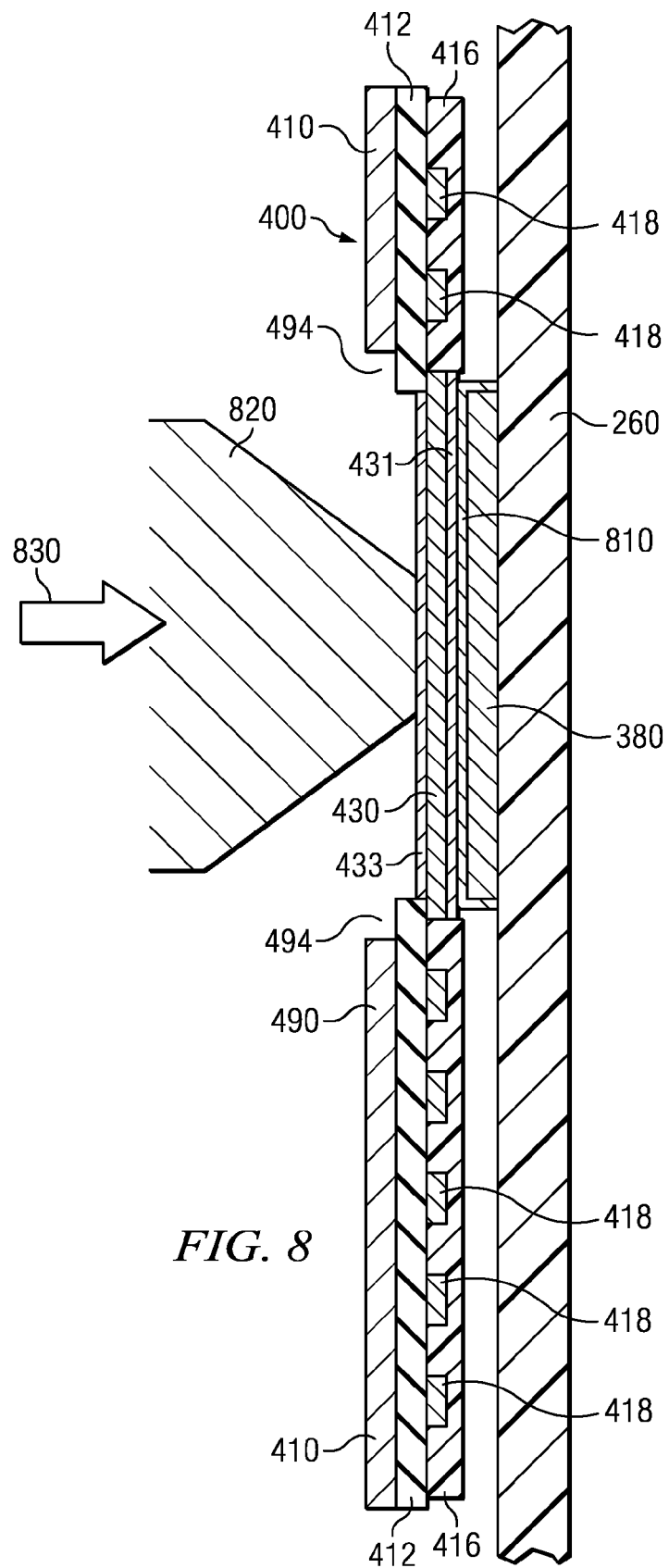
FIG. 8 depicts the bonding of a flexure bond pad to a corresponding flexible printed circuit bond pad by ultrasonic bonding, according to an embodiment of the present invention.

FIG. 8 depicts the bonding of a widened region 430 to a corresponding FPC bond pad 380 by an ultrasonic bonding tool 820, according to an embodiment of the present invention. In such embodiments, the FPC bond pads 380 may each include a gold coating 810 (e.g. a gold plating), with each of the flexure bond pads of the flexure tail 400 being bonded to a corresponding one of the plurality of FPC bond pads 380 by ultrasonic bonding.

Now referring to FIGS. 3, 4, 5, 6, and 8, the ultrasonic bonding tool 820 preferably fits within the structural layer window 494 and may be brought into contact with the widened region 430 (which includes gold coating 431 and may include gold coating 433). The ultrasonic bonding tool 820 may press the gold coating 431 of the widened region 430 against the gold coating 810 of FPC bond pad 380 with a force 830 for a period. During that period, ultrasonic energy may be passed through the ultrasonic bonding tool 810 to bond the gold coating 431 of the widened region 430 with the gold coating 810 of the FPC bond pad 380. Note that, the structural layer 410, dielectric layer 412, and the cover layer 416 are absent from the bond pad at widened region 430, and this facilitates transmission of adequate ultrasonic wave energy from the ultrasonic bonding tool 820 to the gold-to-gold interface between the gold coatings 431 and 810.

Note that the geometry and design of the flexure tail 400 shown in FIG. 7 and FIG. 8 are the same, so that the design of the flexure tail 400 in this embodiment of the invention may accommodate either bonding by ACF (FIG. 7) or by ultrasonic bonding (FIG. 8). Note that the gold coating 810 of the FPC 260 is optional for ACF bonding, and so has been shown as absent in FIG. 7, but still optionally could have been included in FIG. 7 as it was in FIG. 8. Hence the flexure tail 400 of the embodiments shown in FIGS. 7 and 8 advantageously facilitates bonding to the FPC 260 by either ultrasonic gold bonds or anisotropic conductive films.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:

1. A disk drive comprising:
   a disk drive base;
   a disk rotably mounted to the disk drive base;
   an actuator rotably mounted to the disk drive base, the actuator including a flexible printed circuit (FPC) that includes a plurality of electrically conductive FPC bond pads; and
   at least one head gimbal assembly attached to the actuator, the at least one head gimbal assembly comprising
      a read head; and
      a suspension assembly that comprises
         a load beam, and
         a laminate flexure that comprises a structural layer, a dielectric layer, and a conductive layer that includes a plurality of electrical traces, the laminate flexure including a tongue portion that connects to the read head and a flexure tail that extends to the plurality of FPC bond pads, the flexure tail defining a flexure tail longitudinal axis;
   wherein the flexure tail includes a plurality of flexure bond pads, each of the plurality of flexure bond pads being aligned with a corresponding one of the plurality of FPC bond pads, each of the plurality of flexure bond pads consisting of
      a widened region of a corresponding one of the plurality of electrical traces in the conductive layer, and
      a gold coating upon the widened region;
   wherein the widened region of each of the plurality of electrical traces extends transverse to the flexure tail longitudinal axis at least 2.5 times more than it extends parallel to the flexure tail longitudinal axis; and
   wherein a bond exists between each of the flexure bond pads and the corresponding one of the plurality of FPC bond pads, and the bond is an ultrasonic gold bond or an anisotropic conductive film.

2. The disk drive of claim 1 wherein the widened region of each of the plurality of electrical traces defines a widened region width that is measured parallel to the flexure tail longitudinal axis, and that is in the range 150 microns to 200 microns.

3. The disk drive of claim 2 wherein the widened region of each of the plurality of electrical traces defines a widened region area that is at least 0.03 mm².

4. The disk drive of claim 2 wherein the widened region of each of the plurality of electrical traces defines a widened region length that is measured transverse to the flexure tail longitudinal axis, and that is in the range 0.585 mm to 0.600 mm.

5. The disk drive of claim 1 wherein a thickness of the conductive layer is less than 15 microns, and the gold coating is a gold plating with a gold plating thickness of at least 1 microns, and a total thickness at each of the plurality of flexure bond pads is no more than 24 microns.

6. The disk drive of claim 5 wherein the structural layer and the dielectric layer are absent in the plurality of flexure bond pads, but where present in the flexure tail away from the plurality of flexure bond pads, a thickness of the structural layer is at least 15 microns, and a thickness of the dielectric layer is at least 5 microns.

7. The disk drive of claim 1 wherein each of the plurality of flexure bond pads is separated from another in a direction measured parallel to the flexure tail longitudinal axis, by an inter bond pad spacing of at least 0.3 mm but no more than 0.7 mm.

8. The disk drive of claim 1 wherein the bond is the anisotropic conductive film, and the anisotropic conductive film comprises an adhesive material that includes a plurality of electrically conductive beads of substantially similar size.

9. The disk drive of claim 8 wherein the plurality of electrically conductive beads is arranged in a monolayer with each of the plurality of electrically conductive beads in electrical contact with one of the plurality of flexure bond pads and the corresponding one of the plurality of FPC bond pads.

10. The disk drive of claim 1 wherein each of the widened regions of the plurality of electrical traces in the conductive layer has two opposing sides, and wherein the gold coating covers both of the two opposing sides.

11. The disk drive of claim 1 wherein the structural layer comprises stainless steel, the dielectric layer comprises polyimide, and the conductive layer comprises copper.

12. A head gimbal assembly (HGA) for a disk drive, the HGA comprising:
   a read head; and
   a suspension assembly that comprises
      a load beam, and
      a laminate flexure that comprises a structural layer, a dielectric layer, and a conductive layer that includes a plurality of electrical traces, the laminate flexure including a tongue portion that connects to the read head and a flexure tail that extends away from the tongue portion, the flexure tail defining a flexure tail longitudinal axis;
   wherein the flexure tail includes a plurality of flexure bond pads, each of the plurality of flexure bond pads consisting of
      a widened region of a corresponding one of the plurality of electrical traces in the conductive layer, and
      a gold coating upon the widened region
         wherein the widened region of each of the plurality of electrical traces extends transverse to the flexure tail longitudinal axis at least 2.5 times more than it extends parallel to the flexure tail longitudinal axis.

13. The HGA of claim 12 wherein the widened region of each of the plurality of electrical traces defines a widened region width that is measured parallel to the flexure tail longitudinal axis, and that is in the range 150 microns to 200 microns.

14. The HGA of claim 13 wherein the widened region of each of the plurality of electrical traces defines a widened region area that is at least 0.03 mm$^2$.

15. The HGA of claim 13 wherein the widened region of each of the plurality of electrical traces defines a widened region length that is measured transverse to the flexure tail longitudinal axis, and that is in the range 0.585 mm to 0.600 mm.

16. The HGA of claim 12 wherein a thickness of the conductive layer is less than 15 microns, the gold coating is a gold plating having a gold plating thickness of at least 1 micron, and a total thickness at each of the plurality of flexure bond pads is no more than 24 microns.

17. The HGA of claim 16 wherein the structural layer and the dielectric layer are absent in the plurality of flexure bond pads, but where present in the flexure tail away from the plurality of flexure bond pads, a thickness of the structural layer is at least 15 microns, and a thickness of the dielectric layer is at least 5 microns.

18. The HGA of claim 12 wherein each of the plurality of flexure bond pads is separated from another in a direction measured parallel to the flexure tail longitudinal axis, by an inter bond pad spacing of at least 0.3 mm but no more than 0.7 mm.

19. The HGA of claim 12 wherein each of the widened regions of the plurality of electrical traces in the conductive layer has two opposing sides, and wherein the gold coating covers at least both of the two opposing sides.

* * * * *